US008028222B2

(12) United States Patent
Kim et al.

(10) Patent No.: US 8,028,222 B2
(45) Date of Patent: Sep. 27, 2011

(54) APPARATUS AND METHOD FOR IMPROVING TURBO CODE PERFORMANCE IN A COMMUNICATION SYSTEM

(75) Inventors: Noh-Sun Kim, Suwon-si (KR); Yong-Suk Moon, Seongnam-si (KR)

(73) Assignee: Samsung Electronics Co., Ltd (KR)

( * ) Notice: Subject to any disclaimer, the term of this patent is extended or adjusted under 35 U.S.C. 154(b) by 1285 days.

(21) Appl. No.: 11/546,722

(22) Filed: Oct. 12, 2006

(65) Prior Publication Data

US 2007/0101232 A1 May 3, 2007

(30) Foreign Application Priority Data

Oct. 14, 2005 (KR) ........................ 10-2005-0096855

(51) Int. Cl.
*H03M 13/00* (2006.01)
(52) U.S. Cl. ........................................ 714/786
(58) Field of Classification Search .......... 714/748–749, 714/752, 786, 790
See application file for complete search history.

(56) References Cited

U.S. PATENT DOCUMENTS 6,397,367 B1 * 5/2002 Park et al. ..................... 714/786
2004/0187069 A1 9/2004 Pietraski et al.

FOREIGN PATENT DOCUMENTS

| EP | 1 434 356 | 6/2004 |
| EP | 1 511 209 | 3/2005 |
| EP | 1 526 671 | 4/2005 |
| KR | 10-2002-0004479 | 1/2002 |
| WO | WO 03/050992 | 6/2003 |
| WO | WO 2004/084476 | 9/2004 |

* cited by examiner

*Primary Examiner* — Shelly A Chase
(74) *Attorney, Agent, or Firm* — The Farrell Law Firm, P.C.

(57) ABSTRACT

An apparatus and method for improving turbo code performance in a communication system are provided. In the apparatus, a bit inserter inserts a predetermined number of bits into a transmission information bit stream, if the effective coding rate of a transmission packet is a predetermined coding rate. A turbo encoder turbo-encodes a bit stream received from the bit inserter and outputting code symbols. A rate matcher matches the code symbols to a predetermined size.

18 Claims, 9 Drawing Sheets

APPARATUS AND METHOD FOR IMPROVING TURBO CODE PERFORMANCE IN A COMMUNICATION SYSTEM

PRIORITY

This application claims priority under 35 U.S.C. §119 to an application entitled "Apparatus and Method for Improving Turbo Code Performance in a Communication System" filed in the Korean Intellectual Property Office on Oct. 14, 2005 and assigned Serial No. 2005-96855, the contents of which are incorporated herein by reference.

BACKGROUND OF THE INVENTION

1. Field of the Invention

The present invention relates generally to a packet communication apparatus and method in a mobile communication system, and in particular, to an apparatus and method for improving turbo code performance.

2. Description of the Related Art

Mobile communication systems are evolving toward high-speed, high-quality wireless data packet communication systems that can provide data service and multimedia service beyond voice-oriented service. The $3^{rd}$ Generation Partnership Project (3GPP) and 3GPP2 standardization of High Speed Downlink Packet Access (HSDPA) and 1xEvolution in Data and Voice (1xEV-DV) are major examples of efforts expended to find a solution to high-speed, high-quality wireless data packet transmission service at or above 2 Mbps in 3G mobile communication systems.

Obstacles to high-speed, high-quality data service in wireless communications are caused mainly by the wireless channel environment. The wireless channel environment frequently changes due to fading-caused power change, shadowing, Doppler effects arising from the terminal's mobility and frequency mobile velocity changes, and interference from other users and multipath signals. Therefore, the provisioning of high-speed wireless data packet service requires advanced technology that increases adaptability to the channel changes in addition to existing technologies used for 2G or 3G mobile communication systems. While fast power control increases the adaptability to channel changes in the legacy systems, the 3GPP and 3GPP2, which are working on the standardization of a high-speed packet transmission system, commonly address Adaptive Modulation and Coding (AMC) and Hybrid Automatic Repeat Request (HARQ) schemes.

In AMC, a modulation scheme and a coding rate for a channel encoder are selected adaptively according to channel environment. Typically, a Mobile Station (MS) measures the Signal-to-Noise Ratio (SNR) of the downlink and feeds back the SNR measurement to a Base Station (BS). The BS then estimates the downlink channel condition based on the feedback information and selects an appropriate modulation scheme and coding rate according to the estimation.

HARQ is a retransmission technique for, when an initially transmitted packet has errors, retransmitting the packet. HARQ schemes are categorized into Chase Combining (CC), Full Incremental Redundancy (FIR), and Partial Incremental Redundancy (PIR). CC simply retransmits the same initial transmission packet, while FIR retransmits a packet with only redundancy bits generated from a channel encoder, instead of the same initial transmission packet. In PIR, a retransmission packet has information bits and new redundancy bits.

While the AMC and HARQ schemes are mutually independent in increasing adaptability to the changes in the uplink and downlink, their combination can improve system performance considerably. That is, a transmitter selects a modulation scheme and a coding rate suitable for the downlink channel condition by AMC and transmits a data packet using the modulation scheme and coding rate. When a receiver fails to decode the transmitted data packet, it requests a retransmission of the data packet. The BS then retransmits a predetermined data packet according to a predetermined HARQ scheme.

At present, 3 G communication systems (e.g. 1xEV-DV and HSDPA) and 4 G communication systems (e.g. Broadband Wireless Access (BWA)) employ a turbo encoder for transmission and reception of high-speed packet data.

Figure 1:
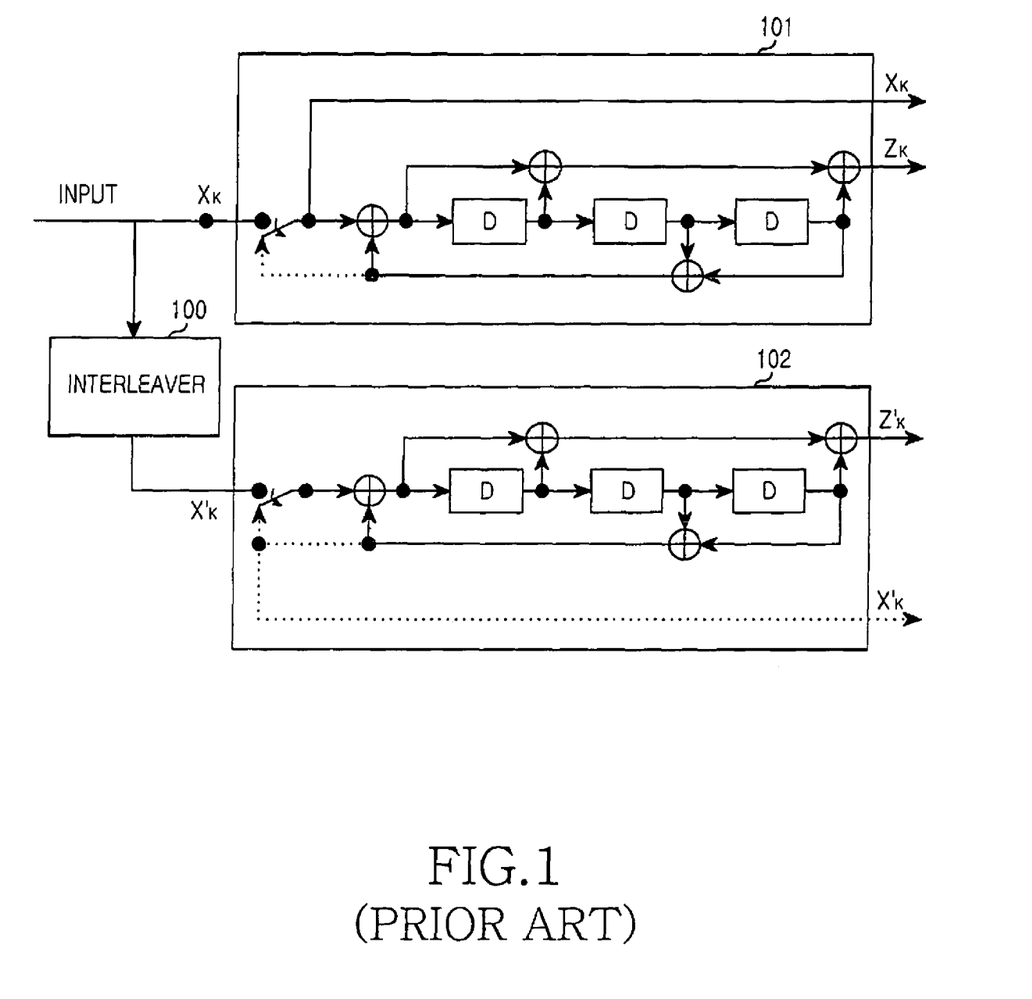
FIG. 1 illustrates the structure of a typical turbo encoder.

FIG. 1 illustrates the structure of a typical turbo encoder.

Referring to FIG. 1, the turbo encoder includes a first constituent encoder 101 for encoding an input information bit stream $x_k$, an internal interleaver 100 for interleaving the input information bit stream $x_k$, and a second constituent encoder 102 for encoding an interleaved information bit stream $x'_k$ received from the interleaver 100. The turbo encoder is additionally provided with an output line via which the input information bit stream $x_k$ passes without encoding. The first and second constituent encoders 101 and 102 can be Recursive Systematic Convolutional (RSC) encoders or Non-Recursive Systematic Convolutional (NSC) encoders. The configuration of these constituent encoders can be changed according to coding rate (R), constraint length (k) and generator polynomial. The interleaver 100 permutes the sequence of the input information bit stream, thus decreasing the correlation between bits in the information bit stream. Elements denoted with D in the constituent encoders represent delay blocks.

Figure 2:
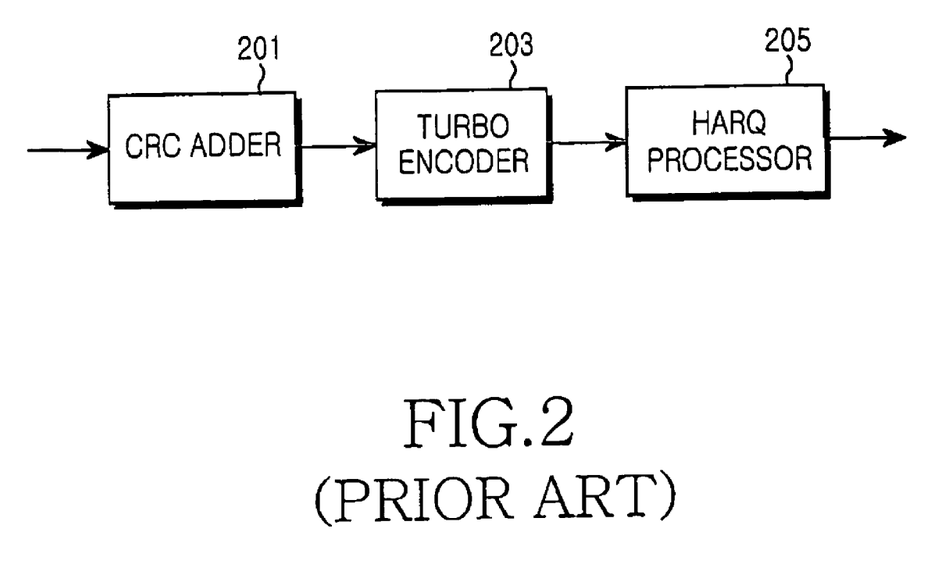
FIG. 2 is a block diagram of a transmitter in a communication system using HARQ.

FIG. 2 is a block diagram of a transmitter in a communication system using HARQ.

Referring to FIG. 2, this communication system supports both AMC and HARQ schemes, and the transmitter includes a Cyclic Redundancy Check (CRC) adder 201, a turbo encoder 203, and an HARQ processor 205.

In operation, the CRC adder 201 calculates a CRC code for an input information bit stream of a predetermined size and adds the CRC code to the end of the information bit stream. The turbo encoder 203 encodes the information bit stream received from the CRC adder 201 at a predetermined coding rate. The HARQ processor 205 is a block for supporting AMC and HARQ. It generates a packet at a corresponding coding rate by rate-matching the coded bit stream received from the turbo encoder 203 through repetition or puncturing. This packet is transmitted through an antenna, after interleaving, modulation, spreading, and Radio Frequency (RF) processing.

The HARQ processor 205 includes a puncturer (not shown) for matching the number of the coded bits received from the turbo encoder 203 to that of bits transmittable on a physical channel. The puncturer matches the size of the channel-coded bit stream to the size requirement for the physical channel, irrespective of AMC and HARQ. Accordingly, the coding rate of the packet generated from the transmitter illustrated in FIG. 2 varies and it is called an "effective coding rate".

Figure 3:
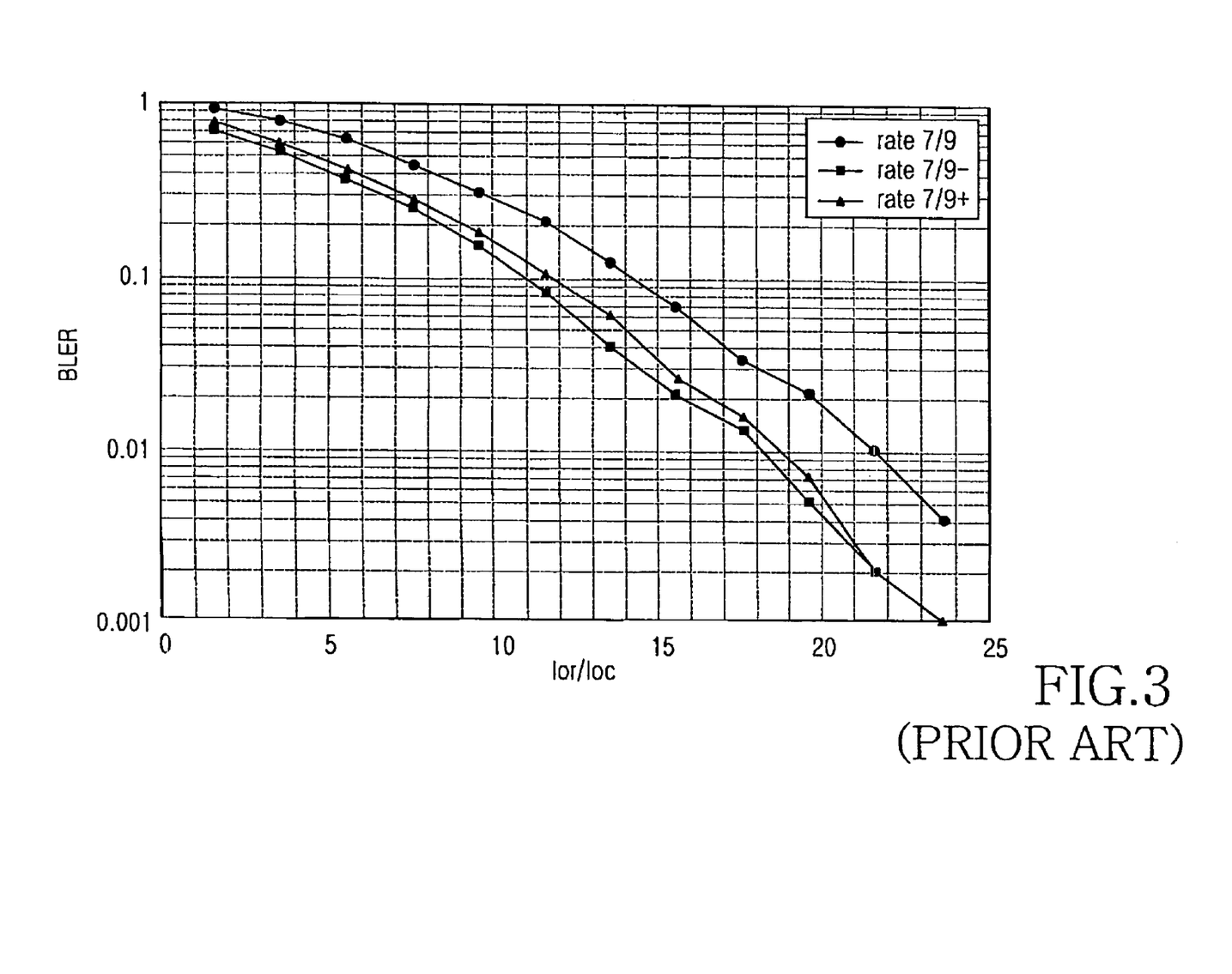
FIG. 3 is a graph illustrating required BS power with respect to effective coding rates at a BLER of about 10% in a HSDPA communication system.

FIG. 3 is a graph illustrating BS power requirements with respect to effective coding rates, for a Block Error Rate (BLER) of about 10% in an HSDPA communication system. Here, horizontal line index is Ior/Ioc wherein Ior is BS total power spectral density and Ioc is white Gaussian noise density.

Referring to FIG. 3, with respect to the origin, the innermost curve denotes an effective coding rate of 0.75 (7/9−), the middle curve denotes an effective coding rate of 0.80 (7/9+), and the outermost curve denotes an effective coding rate of 0.77 (7/9). In general, as the number of punctured bits increases, the effective coding rate and the BLER increase. In other words, required BS power increases. However, the graph illustrated in FIG. 3 reveals unexpected results. In a comparison between the effective coding rates, 0.8 and 0.77, a general expectation is that more transmit power is required for the effective coding rate 0.8 at the same BLER. However, in fact, more transmit power is required for the effective coding rate 0.77. This result is attributed to the nature of the turbo encoder.

Figure 4:
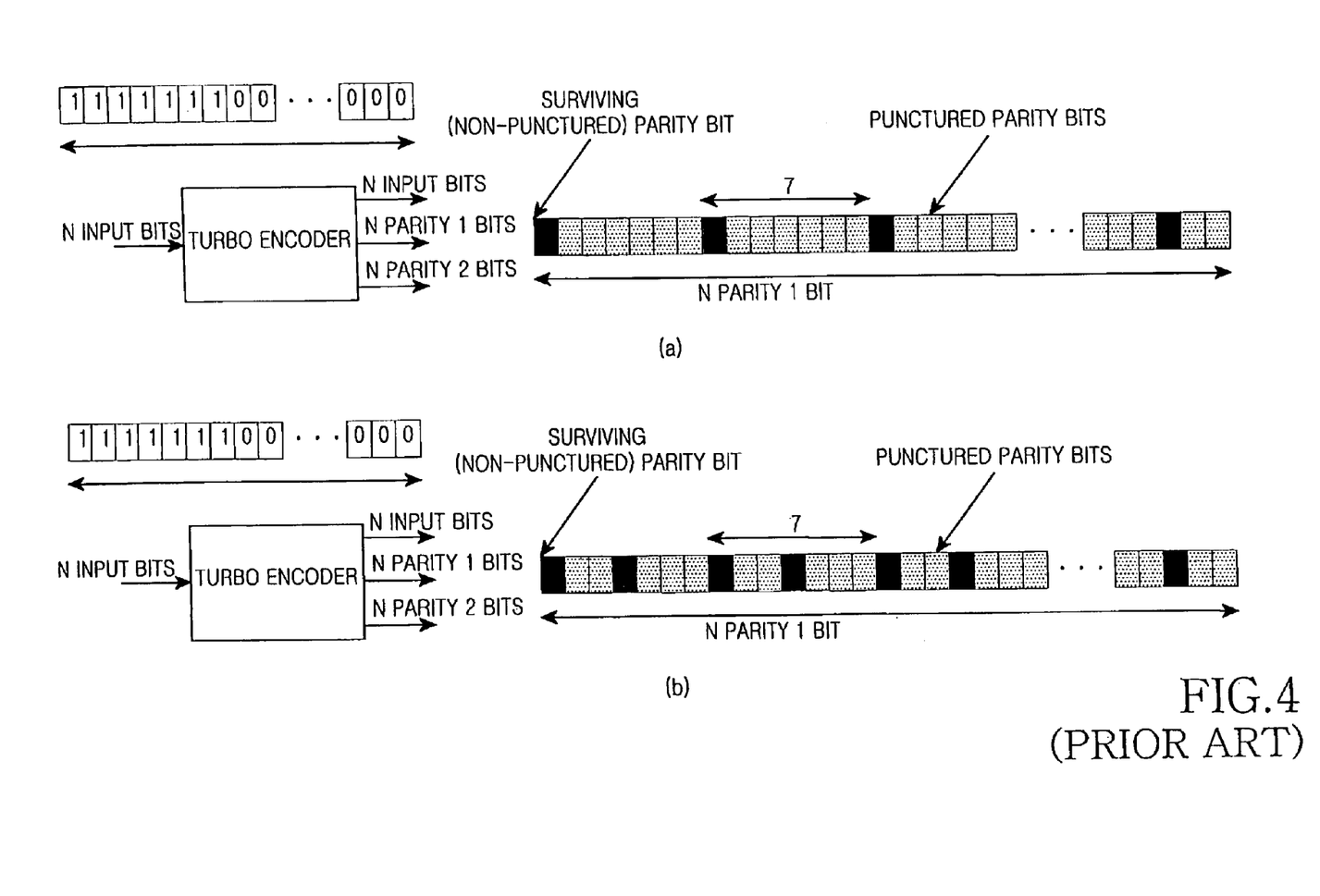
FIG. 4 illustrates performance degradation caused by an identical periodicity between a turbo encoder and a puncturer.

FIGS. 4A and 4B illustrate performance degradation caused by an identical periodicity between the turbo encoder and the puncturer.

When the turbo encoder illustrated in FIG. 1 has a coding rate of 1/3, the constituent encoders (convolutional encoders) have an output period of 7. The output period is determined by the constraint length k and $2^k-1=7$ when k is 3. That is, a first parity sequence (the output of the first constituent encoder) and a second parity sequence (the output of the second constituent encoder) in the turbo encoder are periodic binary sequences which are correlated every seven bits.

As illustrated in FIGS. 4A and 4B, if the puncturer of the HARQ processor 205 has a puncturing period of 7, puncturing takes place at the same bit positions and the remaining bits reside at the same bit positions. In this way, when bits output from a constituent encoder are grouped by sevens and bits are punctured at the same bit positions, turbo code performance is decreased. As illustrated in FIG. 3, this phenomenon appears for a particular effective coding rate. Accordingly, there exists a need for adjusting a puncturing period for a particular effective coding rate causing the degradation of turbo code performance.

SUMMARY OF THE INVENTION

An object of the present invention is to substantially solve at least the above problems and/or disadvantages and to provide at least the advantages below. Accordingly, an object of the present invention is to provide an apparatus and method for adjusting a puncturing period in matching the size of channel-coded bits to that of data transmittable on a physical channel in a mobile communication system using a turbo code.

Another object of the present invention is to provide an apparatus and method for adjusting a turbo encoder input size for a particular effective coding rate in a mobile communication system using rate matching.

A further object of the present invention is to provide an apparatus and method for adjusting a turbo encoder output size for a particular effective coding rate in a mobile communication system using rate matching.

The above objects are achieved by providing an apparatus and method for improving turbo code performance in a communication system.

According to one aspect of the present invention, in an apparatus for improving turbo code performance in a communication system, a bit inserter inserts a predetermined number of bits into a transmission information bit stream, if the effective coding rate of a transmission packet is a predetermined coding rate. A turbo encoder turbo-encodes a bit stream received from the bit inserter and outputs code symbols. A rate matcher matches the code symbols to a predetermined size.

According to another aspect of the present invention, in an apparatus for improving turbo code performance in a communication system, a turbo encoder turbo-encodes a transmission information bit stream and outputs code symbols. A bit inserter inserts a predetermined number of bits into the code symbols, if the effective coding rate of a transmission packet is a predetermined coding rate. A rate matcher matches code symbols received form the bit inserter to a predetermined size.

According to a further aspect of the present invention, in a transmission method in a communication system using a turbo code, the size of a transmission information word is adjusted by inserting a predetermined number of bits into a transmission information bit stream, if the effective coding rate of a transmission packet is a predetermined coding rate. Code symbols are generated by turbo-encoding the size-adjusted information word, rate-matched to a predetermined size, and transmitted.

According to still another aspect of the present invention, in a transmission method in a communication system using a turbo code, code symbols are generated by turbo-encoding a transmission information bit stream. A predetermined number of bits are inserted into the code symbols, if the effective coding rate of a transmission packet is a predetermined coding rate. The bit-inserted code symbols are rate-matched to a predetermined size.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

The present invention provides a method of adjusting a puncturing period to match the size of channel coded bits to a data size suitable for a physical channel.

While the following description is made in the context of a HSDPA system, it is to be appreciated that the present invention is applicable to any system using a turbo encoder (or convolutional encoder) and rate matching.

As described earlier, when a turbo encoder and a puncturer have the same periodicity, turbo code performance is decreased. This phenomenon takes place for a particular effective coding rate. Therefore, the degradation of turbo code performance can be overcome by adjusting a puncturing period for the particular effective coding rate. There are two ways to adjust the puncturing period: adjusting a turbo encoder input size and adjusting a turbo coder output size (parity size). The effective coding rate is determined according to a turbo encoder input size and a data size after rate matching.

Figure 5:
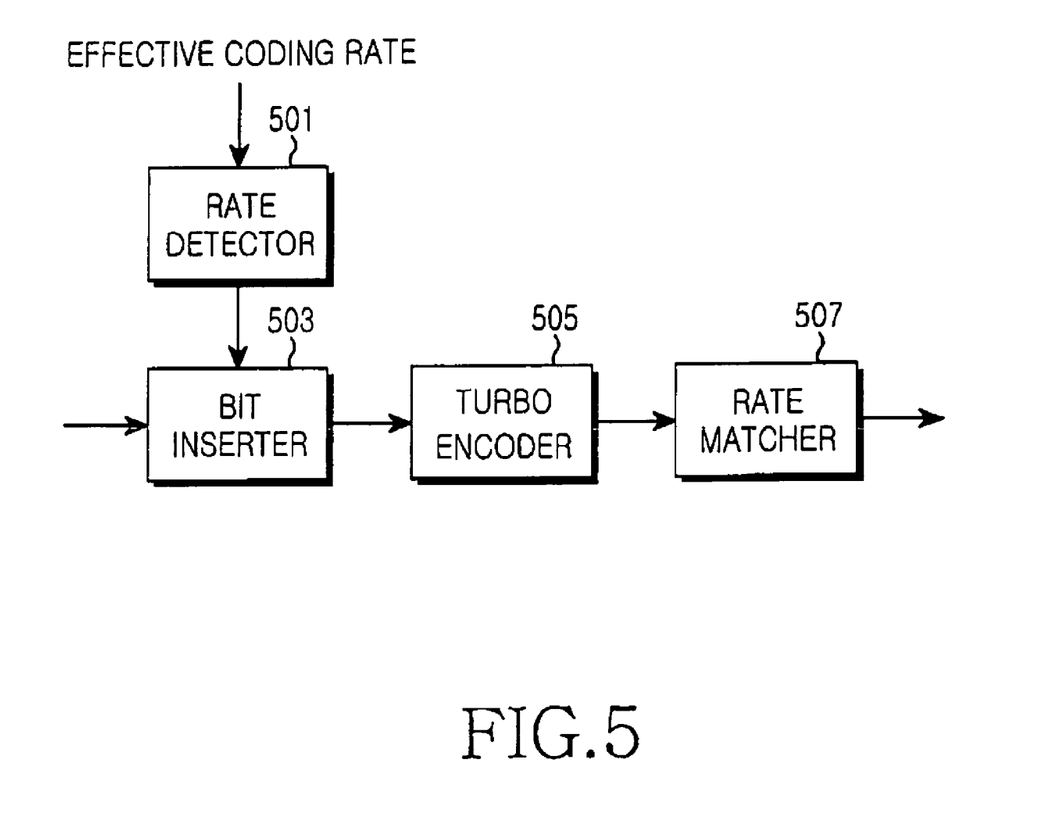
FIG. 5 is a block diagram of a first apparatus for adjusting a puncturing period for rate matching in a mobile communication system using a turbo code according to the present invention.

FIG. 5 is a block diagram of an apparatus for adjusting a puncturing period for rate matching in a mobile communication system using a turbo code according to the present invention.

Referring to FIG. 5, the apparatus includes a rate detector 501, a bit inserter 503, a turbo encoder 505, and a rate matcher 507.

In operation, the rate detector 501 receives an effective coding rate from a higher-layer controller (not shown) and determines the number of bits to be inserted (zero bits) when the effective coding rate is one of predetermined coding rates. These predetermined coding rates are of a predetermined puncturing period (7 for k=3). The bit inserter 503 inserts as many zero bits as determined by the rate detector 501, thus adjusting the input size of the turbo encoder 505.

The turbo encoder 505 turbo-encodes the information bit stream received from the bit inserter 503 at a predetermined coding rate. The rate matcher 507 rate-matches the coded bits by repetition or puncturing, for transmission on a physical channel. Since the input size of the rate matcher 507 is adjusted, the puncturing period (7 for k=3) causing performance degradation can be changed. The rate matcher 507 can be a function block for performing AMC and HARQ.

Figure 6:
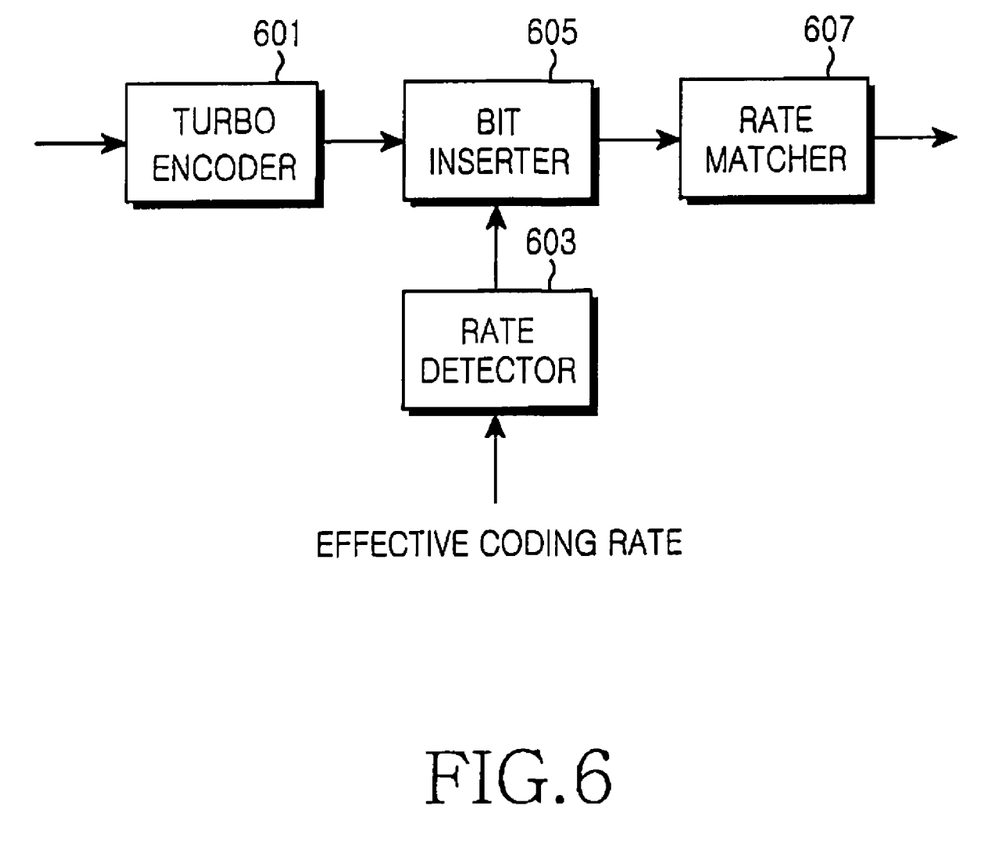
FIG. 6 is a block diagram of a second apparatus for adjusting a puncturing period for rate matching in a mobile communication system using a turbo code according to the present invention.

FIG. 6 is a block diagram of an apparatus for adjusting a puncturing period for rate matching in a mobile communication system using a turbo code according to the present invention.

Referring to FIG. 6, the apparatus includes a turbo encoder 601, a rate detector 603, a bit inserter 605, and a rate matcher 607.

In operation, the turbo encoder 601 turbo-encodes an input information bit stream at a predetermined coding rate. The rate matcher 603 receives an effective coding rate from a higher-layer controller (not shown) and determines the number of bits to be inserted (zero bits) when the effective coding rate is one of predetermined coding rates. These predetermined coding rates are of a predetermined puncturing period (7 for k=3).

The bit inserter 605 inserts as many zero bits as determined by the rate detector 603. Since the output of the turbo encoder 601 includes an information word part, a first parity part, and a second parity part and the parity parts are punctured, the bit inserter 605 inserts a zero bit stream in one of the first and second parity parts, or in both. Thus, the bit inserter 605 adjusts the input size of the rate matcher 607.

The rate matcher 607 rate-matches the coded bits received from the bit inserter 605 by repetition or puncturing, for transmission on a physical channel. Since the input size of the rate matcher 607 is adjusted, the puncturing period (7 for k=7) causing performance degradation can be changed. The rate matcher 607 can be a function block for performing AMC and HARQ.

Figure 7:
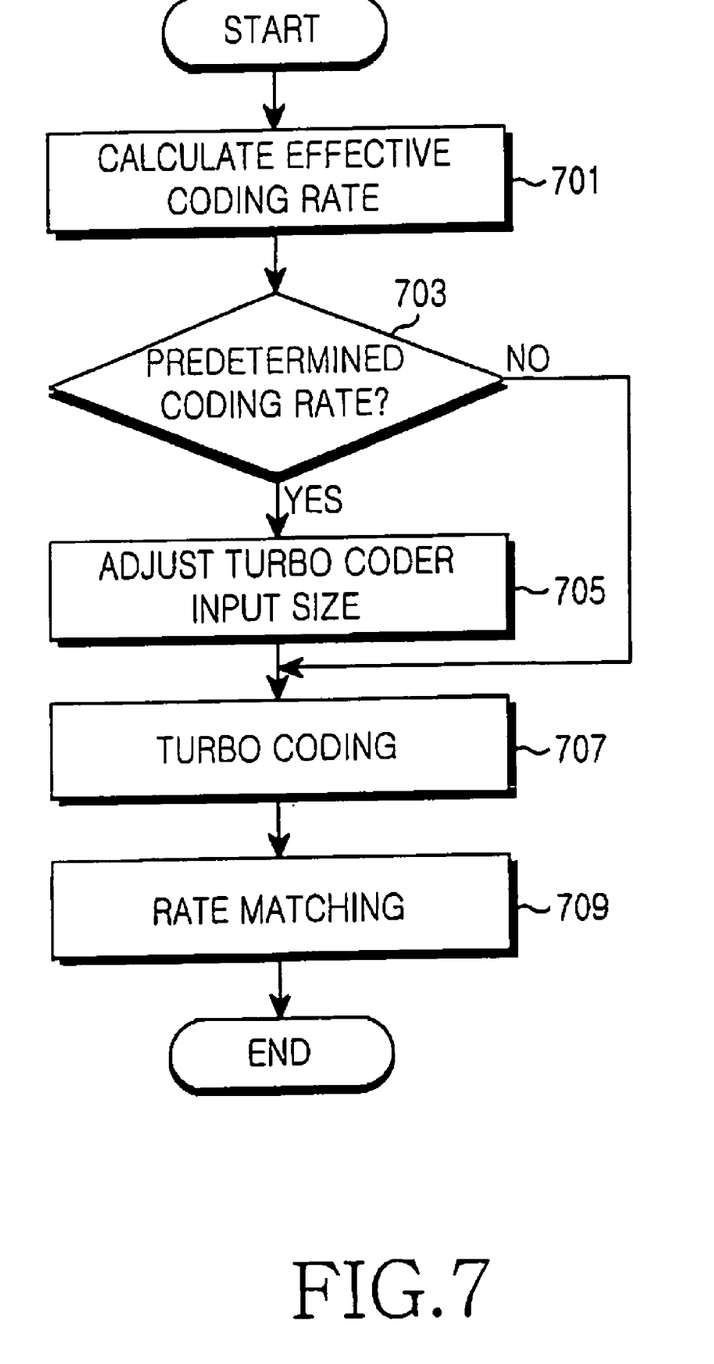
FIG. 7 is a flowchart illustrating a first rate matching operation in a transmitter using a turbo encoder according to the present invention.

FIG. 7 is a flowchart illustrating a rate matching operation in a transmitter using a turbo encoder according to the present invention.

Referring to FIG. 7, the transmitter calculates an effective coding rate for a transmission packet in step 701. The effective coding rate is determined according to the input data size of the channel encoder (i.e. turbo encoder and the size of rate-matched data. In step 703, the transmitter determines whether the effective coding rate is one of preset coding rates having a particular puncturing period (7 for k=3).

If the effective coding rate is none of the preset coding rates, the transmitter jumps to step 707. If the effective coding rate is one of the preset coding rates, the transmitter adjusts a turbo coder input size by inserting a predetermined number of bits into an information bit stream input to the turbo encoder in step 705 and then proceeds to step 707.

The transmitter generates a codeword by turbo-encoding the information bit stream at a predetermined coding rate in step 707. The codeword includes an information word, a first parity, and a second parity.

In step 709, the transmitter generates packet data to be transmitted on a physical channel by rate-matching the codeword through repetition or puncturing. Since the size of rate-matched data is adjusted for the particular effective coding rate, the puncturing period (7 for k=3) causing performance degradation is changed.

Figure 8:
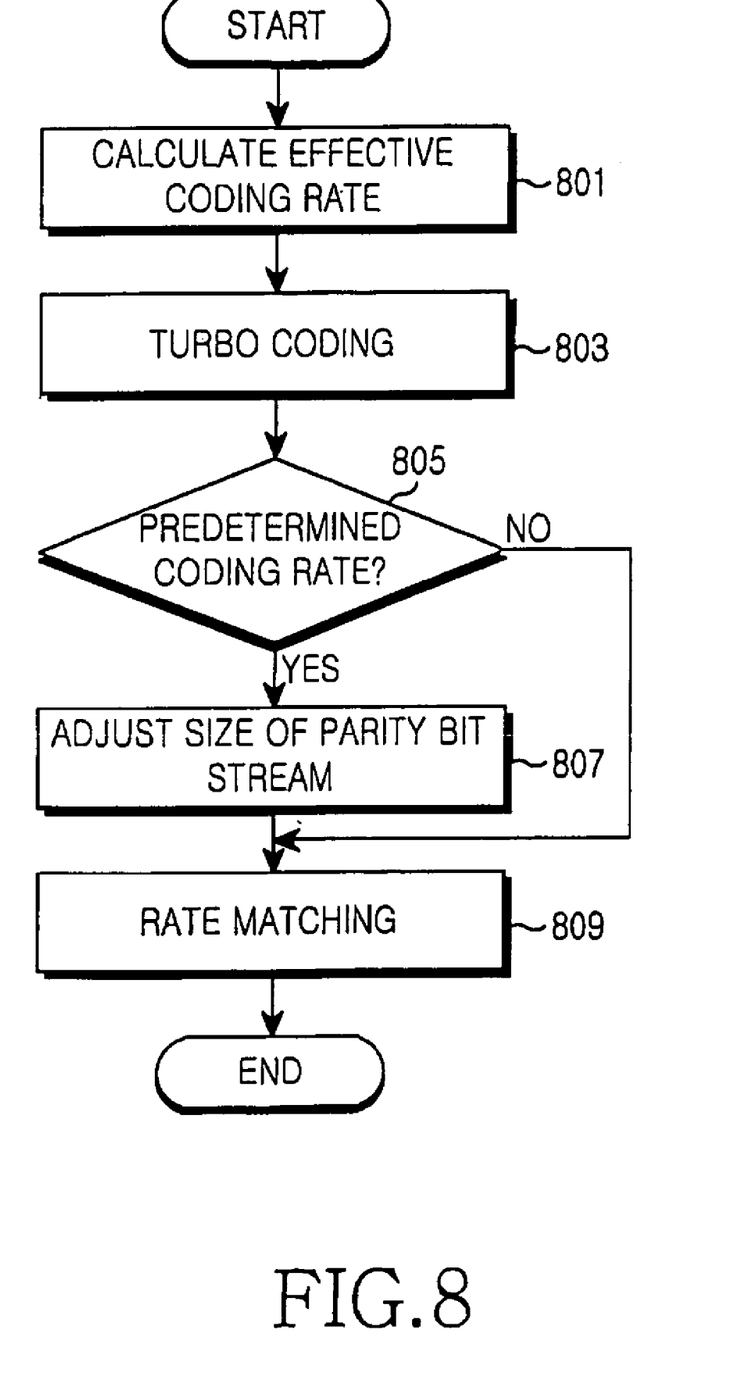
FIG. 8 is a flowchart illustrating a second rate matching operation in a transmitter using a turbo encoder according to the present invention.

FIG. 8 is a flowchart illustrating a rate matching operation in a transmitter using a turbo encoder according to the present invention.

Referring to FIG. 8, the transmitter calculates an effective coding rate for a transmission packet in step 801. The effective coding rate is determined according to the input data size of the channel encoder (i.e. turbo encoder and the size of rate-matched data). In step 803, the transmitter generates a codeword by turbo-encoding an information bit stream of a predetermined size at a predetermined coding rate. The codeword includes an information word, a first parity, and a second parity.

In step 805, the transmitter determines whether the effective coding rate is one of preset coding rates having a particular puncturing period (7 for k=3). If the effective coding rate is none of the preset coding rates, the transmitter jumps to step 809. If the effective coding rate is one of the preset coding rates, the transmitter adjusts a turbo coder output size by inserting a predetermined number of bits into one of the first and second parities in step 807 and then proceeds to step 809.

In step 809, the transmitter generates packet data to be transmitted on a physical channel by rate-matching the codeword through repetition or puncturing. Since the size of rate-matched data is adjusted for the particular effective coding rate, the puncturing period (7 for k=3) causing performance degradation is changed.

Figure 9:
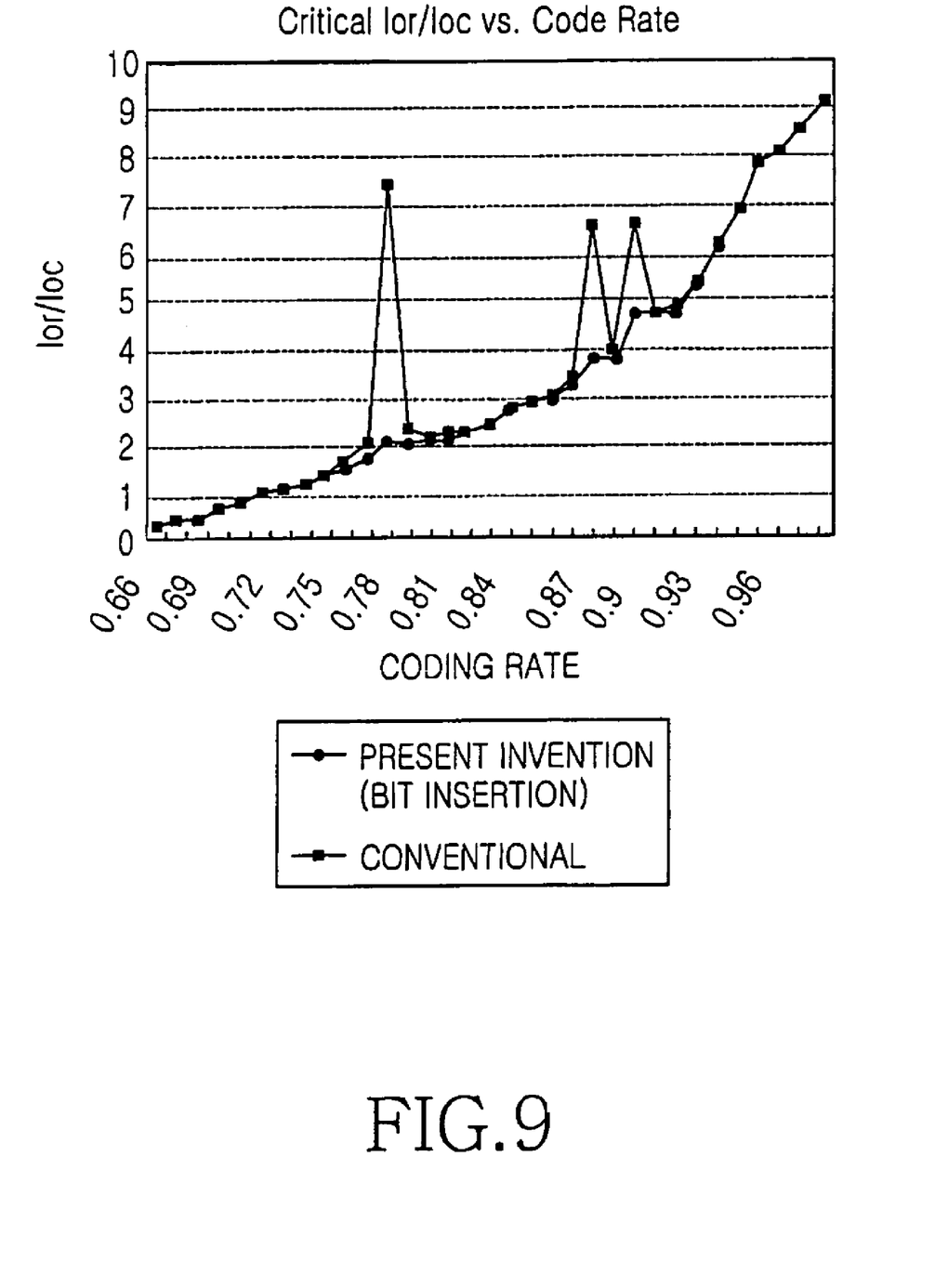
FIG. 9 is a graph illustrating BS power satisfying a Frame Error Rate (FER) of 10% with respect to effective coding rates.

Simulation results of the present invention are represented as a graph in FIG. 9.

FIG. 9 is a graph illustrating BS power satisfying an FER of 10% with respect to effective coding rates. Here, horizontal line index is Ior/Ioc wherein for is BS total power spectral density and Ioc is white Gaussian noise density.

Referring to FIG. 9, a conventional turbo encoder requires very much power to satisfy an FER of 10% at a particular coding rate, which leads to performance degradation For example, it requires more power than 7 dB at an effective coding rate of 0.78. However, the bit insertion method of the present invention enables stable use of BS power on the whole. That is, the use of the bit insertion method significantly improves the performance of the conventional system.

In accordance with the present invention as described above, performance degradation caused by a particular effective coding rate can be prevented in a communication system using a turbo encoder and rate matching. That is, since a particular puncturing period at a particular coding rate is changed by simple bit insertion, turbo code performance is greatly improved.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An apparatus for improving turbo code performance in a communication system, comprising:
    a bit inserter for inserting a predetermined number of bits into a transmission information bit stream, if the effective coding rate of a transmission packet is a predetermined coding rate;
    a turbo encoder for turbo-encoding a bit stream received from the bit inserter and outputting code symbols; and
    a rate matcher for matching the code symbols to a predetermined size,
    wherein the rate matcher processes adaptive modulation and coding (AMC) and hybrid automatic repeat request (HARQ) schemes.

2. The apparatus of claim 1, wherein a puncturing pattern used for the rate matching has a predetermined period.

3. The apparatus of claim 2, wherein the predetermined period is determined by the constraint length of a constituent encoder in the turbo encoder.

4. An apparatus for improving turbo code performance in a communication system, comprising:
    a turbo encoder for turbo-encoding a transmission information bit stream and outputting code symbols;
    a bit inserter for inserting a predetermined number of bits into the code symbols, if the effective coding rate of a transmission packet is a predetermined coding rate; and
    a rate matcher for rate-matching code symbols received from the bit inserter to a predetermined size.

5. The apparatus of claim 4, wherein a puncturing pattern used for the rate matching has a predetermined period.

6. The apparatus of claim 5, wherein the predetermined period is determined by the constraint length of a constituent encoder in the turbo encoder.

7. The apparatus of claim 4, wherein the rate matcher processes adaptive modulation and coding (AMC) and hybrid automatic repeat request (HARQ) schemes.

8. The apparatus of claim 4, wherein the code symbols are divided into an information word part, a first parity part, and a second parity part, and the bit inserter inserts the predetermined number of bits into one of the first and second parity parts.

9. A transmission method in a communication system using a turbo code, comprising the steps of:
    adjusting the size of a transmission information word by inserting a predetermined number of bits into a transmission information bit stream, if the effective coding rate of a transmission packet is a predetermined coding rate;
    generating code symbols by turbo-encoding the size-adjusted information word; and
    rate-matching the code symbols to a predetermined size and transmitting the rate-matched code symbols,
    wherein adaptive modulation and coding (AMC) and hybrid automatic repeat request (HARM) schemes are processed by the rate matching.

10. The transmission method of claim 9, wherein a puncturing pattern used for the rate matching has a predetermined period.

11. The transmission method of claim 10, wherein the predetermined period is determined by the constraint length of a constituent encoder in a turbo encoder.

12. A transmission method in a communication system using a turbo code, comprising the steps of:
    generating code symbols by turbo-encoding a transmission information bit stream;
    inserting a predetermined number of bits into the code symbols, if the effective coding rate of a transmission packet is a predetermined coding rate; and
    rate-matching the bit-inserted code symbols to a predetermined size.

13. The transmission method of claim 12, wherein a puncturing pattern used for the rate matching has a predetermined period.

14. The transmission method of claim 13, wherein the predetermined period is determined by the constraint length of a constituent encoder in a turbo encoder.

15. The transmission method of claim 12, wherein adaptive modulation and coding (AMC) and hybrid automatic repeat request (HARQ) schemes are processed by the rate matching.

16. The transmission method of claim 12, wherein the code symbols are divided into an information word part, a first parity part, and a second parity part, and the bit inserting step comprises inserting the predetermined number of bits into one of the first and second parity parts.

17. A communication system comprising:
    a rate detector for detecting a coding rate and determining a number of bits to be inserted, when the effective coding rate is one of predetermined coding rates;
    a bit inserter for inserting the number of bits into a transmission information bit stream;
    a turbo encoder for turbo-encoding a bit stream received from the bit inserter and outputting code symbols; and
    a rate matcher for matching the code symbols to a predetermined size.

18. A communication system comprising:
    a turbo encoder for turbo-encoding a transmission information bit stream and outputting code symbols;
    a rate detector for detecting a coding rate and determining a number of bits to be inserted;
    a bit inserter for inserting the number of bits into the code symbols; and
    a rate matcher for rate-matching code symbols received from the bit inserter to a predetermined size.

* * * * *